(12) United States Patent
Kluth et al.

(10) Patent No.: US 6,602,754 B1
(45) Date of Patent: *Aug. 5, 2003

(54) NITROGEN IMPLANT INTO NITRIDE SPACER TO REDUCE NICKEL SILICIDE FORMATION ON SPACER

(75) Inventors: George J. Kluth, Los Gatos, CA (US); Minh Van Ngo, Fremont, CA (US); Paul R. Besser, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/059,039

(22) Filed: Jan. 30, 2002

Related U.S. Application Data

(60) Provisional application No. 60/265,630, filed on Feb. 2, 2001.

(51) Int. Cl.[7] .............................................. H01L 21/336
(52) U.S. Cl. ..................................................... 438/303
(58) Field of Search .................................. 438/303, 305, 438/480

(56) References Cited

U.S. PATENT DOCUMENTS 5,508,212 A * 4/1996 Wang et al. ................... 437/24
5,648,287 A * 7/1997 Tsai et al. ...................... 437/44
6,465,349 B1 * 10/2002 Ngo et al. .................. 438/682

* cited by examiner

Primary Examiner—Hoai Ho
Assistant Examiner—Quoc Hoang

(57) ABSTRACT

Bridging between silicide layers on a gate electrode and source/drain regions along silicon nitride sidewall spacers is prevented by implanting the exposed surfaces of the silicon nitride sidewall spacers with nitrogen to create a surface region having an increased nitrogen concentration. Embodiments include implanting the silicon nitride sidewall spacers with nitrogen such that the nitrogen concentration of the exposed surface is increased by about 5% to about 15%, thereby substantially preventing the formation of metal silicide on the sidewall spacers.

13 Claims, 2 Drawing Sheets

NITROGEN IMPLANT INTO NITRIDE SPACER TO REDUCE NICKEL SILICIDE FORMATION ON SPACER

RELATED APPLICATIONS

This application claims priority from Provisional Application No. 60/265,630 filed Feb. 2, 2001, the entire disclosure of which is hereby incorporated by reference herein. This application contains subject matter similar to subject matter disclosed in copending U.S. patent applications: Ser. No. 09/679,372, filed on Oct. 5, 2000 ; Ser. No. 09/679,373, filed on Oct. 5, 2000 ; Ser. No. 09/679,880, filed on Oct. 5, 2000 ; Ser. No. 09/679,375, filed on Oct. 5, 2000 ; Ser. No. 09/679,374, filed on Oct. 5, 2000 , and Ser. No. 09/679,871, filed on Oct. 5, 2000.

TECHNICAL FIELD

The present invention relates to the fabrication of semiconductor devices, particularly to self-aligned silicide (salicide) technology, and the resulting semiconductor devices. The present invention is particularly applicable to ultra large scale integrated circuit (ULSI) systems having features in the deep sub-micron size range.

BACKGROUND ART

As integrated circuit geometries continue to plunge into the deep sub-micron regime, it becomes increasingly more difficult to accurately form discreet devices on a semiconductor substrate exhibiting the requisite reliability. High performance microprocessor applications require rapid speed of semiconductor circuitry. However, scaling down device components such as source and drain junctions, and scaling down the width of polycrystalline silicon lines, increases parasitic resistance in the source and drain disunion layers and gate electrode diffusion layer, and also increases the sheet and contact resistance of the gate electrode and source and drain regions. Since the speed of semiconductor circuitry is adversely affected by high resistance, low resistivity interconnection paths are critical to fabricating dense, high performance devices.

A common approach to reduce the resistivity of the interconnects to less than that exhibited by polysilicon alone, e.g., less than about 15–300 ohm/sq, comprises forming a multilayer structure consisting of a low resistance material, e.g., a refractory metal silicide, on a doped polycrystalline silicon layer, typically referred to as a polycide. Advantageously, the polycide gate/interconnect structure preserves the known work function of polycrystalline silicon and the highly reliable polycrystalline silicon/silicon oxide interface, since polycrystalline silicon is directly on the gate oxide.

Various refractory metal suicides have been employed in polycide technology, such as titanium, tungsten, and cobalt silicides. Nickel, however, offers particular advantages vis-à-vis other metals. Nickel requires a lower thermal budget; that is, nickel silicide and can be formed in a single heating step at a relatively low temperature of about 250° C. to about 600° C. with an attendant reduction in consumption of silicon in the substrate, thereby enabling the formation of ultra-shallow source/drain junctions.

In conventional self-aligned silicide, or "salicide" technology, a layer of the refractory metal is deposited on a gate electrode, typically comprising polysilicon with dielectric sidewall spacers, and on exposed surfaces of the source/drain regions, followed by heating to react the metal with underlying silicon to form the metal silicide. Unreacted metal is then removed from the dielectric sidewall spacers leaving metal silicide contacts on the upper surface of the gate electrode and on the source/drain regions. In implementing salicide technology, it is also advantageous to employ silicon nitride sidewall spacers, since silicon nitride is highly conformal and enhances device performance, particularly for p-type transistors. However, although silicon nitride spacers are advantageous from such processing standpoints, it is extremely difficult to effect nickel silicidation of the gate electrode and source/drain regions without undesirable nickel silicide bridging and, hence, short circuiting, therebetween along the surface of the silicon nitride sidewall spacers.

Accordingly, there exists a need for salicide methodology enabling the implementation of nickel silicide interconnection systems without bridging between the nickel silicide layers on the gate electrode and the source/drain regions, particularly when employing silicon nitride sidewall spacers on the gate electrode.

SUMMARY OF THE INVENTION

An advantage of the present invention is a method of manufacturing a semiconductor device having nickel silicide contacts on a gate electrode and associated source/drain regions without bridging therebetween along insulative sidewall spacers, notably silicon nitride sidewall spacers.

Additional advantages and other features of the present invention will be set forth in part in the description which follows, and in part will become apparent to those having ordinary skill in the art upon examination of the following or may be learned by practice of the present invention. The advantages of the present invention may be realized and obtained as particularly pointed out in the appended claims.

According to the present invention, the foregoing and other advantages are achieved in part by a method of manufacturing a semiconductor device, the method comprising forming a gate electrode, having opposing side surfaces, on a substrate with a gate insulating layer therebetween; forming silicon nitride sidewall spacers on the opposing side surfaces of the gate electrode, leaving exposed adjacent surfaces of the substrate; implanting exposed surfaces of the silicon nitride sidewall spacers with nitrogen; depositing a layer of refractory metal on the gate electrode and the exposed surfaces of the substrate; and heating to react the metal layer with underlying silicon to form a layer of metal silicide on the gate electrode and a layer of metal silicide on the exposed surfaces of the substrate.

Additional advantages of the present invention will become readily apparent to those having ordinary skill in the art from the following detailed description, wherein embodiments of the present invention are described simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

DESCRIPTION OF THE INVENTION

Figure 1:
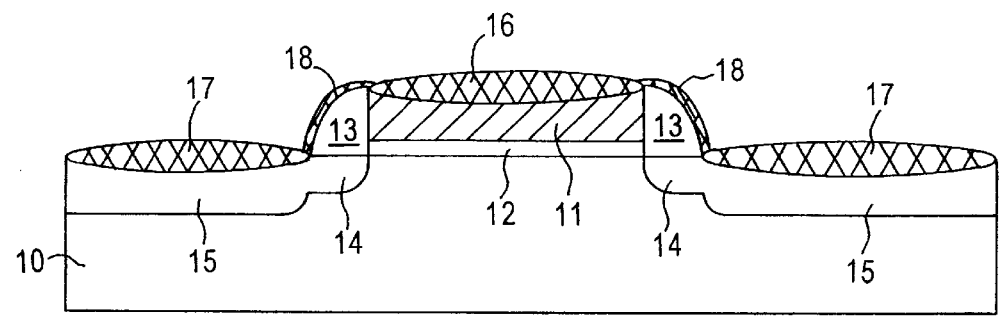
FIG. 1 schematically illustrates problematic nickel silicide bridging attendant upon implementing nickel salicide methodology with silicon nitride sidewall spacers using conventional practices.
Figure 2:
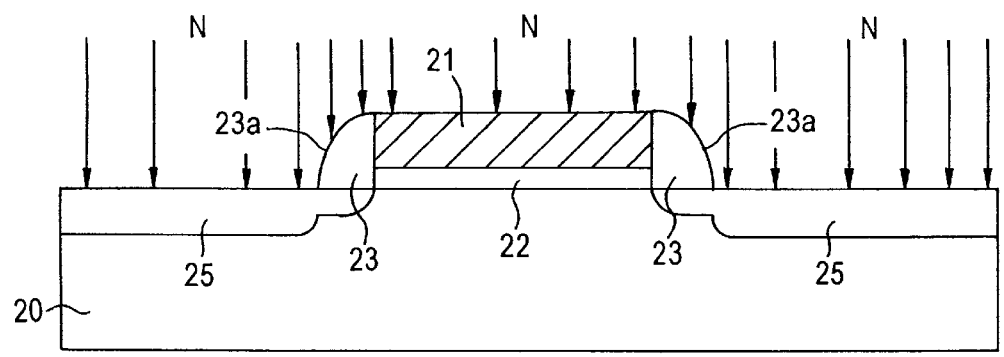
FIGS. 2–5 schematically illustrate sequential phases in accordance with an embodiment of the present invention, wherein like features are denoted by like reference numerals.
Figure 3:
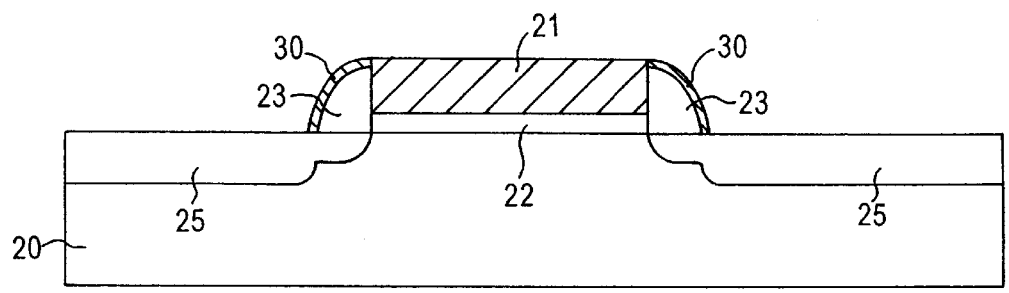

The present invention addresses and solves problems attendant upon implementing conventional salicide technology, especially when employing nickel as the metal for silicidation. As device geometries shrink into the deep sub-micron regime, nickel silicide bridging occurs along the surface of silicon nitride sidewall spacers between the nickel silicide layer on the gate electrode and nickel silicide layers on associated source/drain regions. For example, adverting to FIG. 1, in attempting to implement nickel salicide technology utilizing silicon nitride sidewall spacers, a gate electrode 11 is formed on substrate 10 with gate insulating layer 12 therebetween. A conformal layer of silicon nitride is then deposited followed by anisotropic etching to form silicon nitride spacers 13 on opposing side surfaces of gate electrode 11. Shallow source/drain extensions 14 and source/drain regions 15 are then formed in a conventional manner. A layer of nickel is thereafter deposited, followed by heating, resulting in the formation of a nickel silicide layer 16 on the upper surface of gate electrode 11 and a layer of nickel silicide 17 on associated source/drain regions 15. However, a thin layer of nickel silicide 18, as at a thickness of about 30 Å to 60 Å, undesirably forms along the exposed surfaces of the silicon nitride sidewall spacers 13 causing bridging and, hence, shorting between nickel silicide layer 16 and nickel silicide layers 17.

After considerable experimentation arid investigation, it has been postulated that the problem of nickel silicide formation 18 along the silicon nitride sidewall spacers 13 stems from the reaction of nickel with dangling silicon bonds in the silicon nitride sidewall spacer. In accordance with embodiments of the present invention, the surface of the silicon nitride sidewall spacers is implanted with nitrogen before nickel deposition. The nitrogen implantation increases the concentration of nitrogen on the exposed surfaces of the silicon nitride sidewall spacers, forming a nitrogen-rich surface region having less silicon with dangling bonds than the remainder of the silicon nitride sidewall spacer. By creating a nitrogen-rich surface region, reaction between deposited nickel and silicon in the sidewall spacers is reduced, thereby avoiding nickel silicide bridging. Accordingly, embodiments of the present invention enable nickel silicidation without undesirable bridging, such as that denoted by reference numeral 18 in FIG. 1.

An embodiment of the present invention is schematically illustrated in FIGS. 2 through 5, wherein similar reference numerals denote similar features. Adverting to FIG. 2, a gate electrode 21, e.g., doped polycrystalline silicon, is formed on semiconductor substrate 20, which can be n-type or p-type, with a gate insulating layer 22 therebetween. Gate insulating layer 22 is typically silicon dioxide formed by thermal oxidation or chemical vapor deposition (CVD).

Subsequent to forming gate electrode 21, silicon nitride sidewall spacers 23 are formed by depositing a conformal layer and anisotropically etching. Silicon nitride sidewall spacers 23 can be formed in a known manner; e.g., by plasma enhanced chemical vapor deposition (PECVD). Silicon nitride sidewall spacers 23 typically have a thickness of about 850Å to about 950Å.

After forming silicon nitride spacers 23, contamination, such as etching residues, is removed and shallow source/drain regions 24 are formed in a conventional manner, as by ion implantation. Silicon nitride sidewall spacers 23 are then implanted with nitrogen in a conventional manner, as indicated by arrows N, to increase the nitrogen concentration in the exposed surfaces 23a of sidewall spacers 23. The nitrogen implantation is performed at an energy of about 5 keV to about 20 keV to keep the nitrogen close to the exposed surface 23a, thereby forming a surface region 30 (see FIG. 3) having a nitrogen concentration increased by about 5% to about 15% and a thickness of about 100 Å to about 200 Å. The nitrogen dosage can be about $5 \times 10^{14}$ cm$^{-2}$ to about $10^{16}$ cm$^{-2}$. The implanted nitrogen isotope can be either atomic nitrogen ($^{14}$N) or molecular nitrogen ($^{28}$N$_2$).

Figure 4:
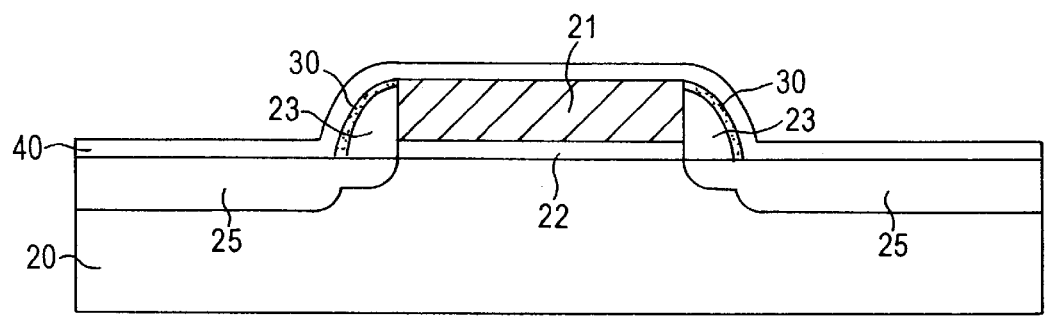
Figure 5:
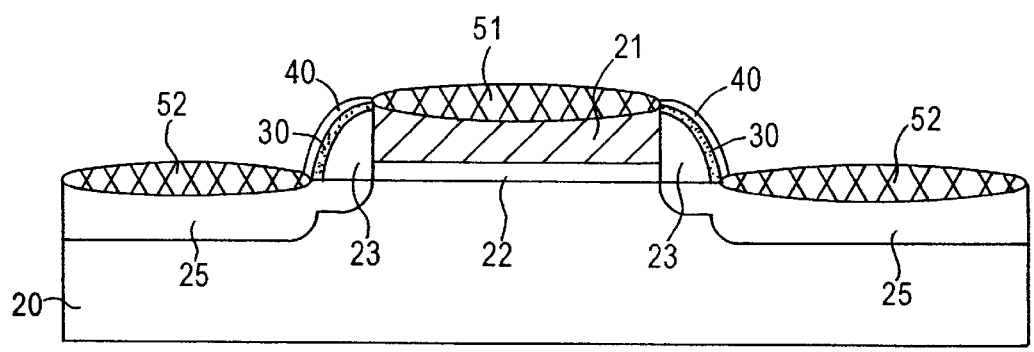

Subsequently, a conformal layer of nickel 40 is deposited, as at a thickness of about 150 Å to about 500 Å, e.g., about 300 Å (see FIG. 4). Rapid thermal annealing, as at a temperature of about 250° C. to about 600° C., e.g., about 400° C. to about 600° C., is then conducted during which nickel silicide layer 51, illustrated in FIG. 5, is formed on gate electrode 21 while nickel silicide layers 52 are formed on exposed portions of the substrate adjacent sidewall spacers 23. The nickel silicide layers typically have a thickness of about 200 Å to about 400 Å, e.g., about 300 Å. By avoiding sensitization of silicon and forming a nitrogen-rich surface region 30 on silicon nitride sidewall spacers 23, reaction of nickel layer 40 with silicon in sidewall spacers 23 is effectively prevented. Accordingly, the inventive methodology avoids the formation of nickel silicide on silicon nitride sidewall spacers 23 and, hence, prevents bridging between nickel silicide layer 51 on the upper surface of gate electrode 21 and nickel silicide layers 52 on the exposed surfaces of the silicon substrate adjacent silicon nitride sidewall spacers 23. Unreacted nickel on the surfaces of silicon nitride sidewall spacers 23 is then easily removed, as by well-known wet processing techniques, e.g., treating with a mixture of sulfuric acid and hydrogen peroxide with a ratio of sulfuric acid: hydrogen peroxide of about 1:12 to about 1:4, e.g., about 1:2.

The present invention, therefore, enables the implementation of nickel salicide methodology, advantageously utilizing silicon nitride sidewall spacers without bridging between the nickel silicide layer formed on the upper surface of the gate electrode and the nickel silicide layers formed on associated source/drain regions. Moreover, the usefulness of the present methodology is not limited to nickel salicide formation. The present method can be used for preventing bridging during the formation of any refractory metal silicide, such as cobalt silicide, when silicon nitride spacers are present. The present invention is applicable to the production of any of various types of semiconductor devices. The present invention is particularly applicable in manufacturing semiconductor devices with high circuit speeds having design features in the deep sub-micron regime.

In the preceding detailed description, the present invention is described with reference to specifically exemplary embodiments thereof. It will, however, be evident that various modifications and changes may be made thereto without departing from the broader spirit and scope of the present invention, as set forth in the claims. The specification and drawings are, accordingly, to be regarded as illustrative and not restrictive. It is understood that the present invention is capable of using various other combinations and environments and is capable of changes or modifications within the scope of the inventive concept as expressed herein.

What is claimed is:

1. A method of manufacturing a semiconductor device, the method comprising:

forming a gate electrode, having opposing side surfaces, on a substrate with a gate insulating layer therebetween;

forming silicon nitride sidewall spacers on the opposing side surfaces of the gate electrode, leaving exposed adjacent surfaces of the substrate;

implanting exposed surfaces of the silicon nitride sidewall spacers with nitrogen;

depositing a layer of refractory metal on the gate electrode and the exposed surfaces of the substrate; and heating to react the metal layer with underlying silicon to form a layer of metal silicide on the gate electrode and a layer of metal silicide on the exposed surfaces of the substrate.

2. The method according to claim 1, wherein the depositing step comprises depositing a layer of nickel, and the metal silicide layers comprise nickel silicide.

3. The method according to claim 2, comprising depositing the layer of nickel at a thickness of about 150 Å to about 500Å.

4. The method according to claim 2, comprising heating at a temperature of about 400° C. to about 600° C. to form the layers of nickel silicide.

5. The method according to claim 2, comprising removing unreacted nickel from the silicon nitride sidewall spacers.

6. The method according to claim 1, comprising implanting the exposed surfaces of the silicon nitride sidewall spacers with nitrogen to increase a nitrogen concentration in the exposed surfaces of the sidewall spacers, thereby substantially preventing the formation of metal silicide on the sidewall spacers upon heating to react the metal with the underlying silicon.

7. The method according to claims 6, comprising implanting the exposed surfaces of the silicon nitride sidewall spacers with nitrogen to increase the nitrogen concentration of the exposed surface by about 5 percent to about 15 percent.

8. The method according to claim 7, comprising implanting the exposed surfaces of the silicon nitride sidewall spacers with nitrogen to form an exposed surface region of the sidewall spacers having a thickness of about 100 Å to about 200Å.

9. The method according to claim 8, comprising implanting the nitrogen with an energy of about 5 keV to about 20 keV.

10. The method according to claim 7, comprising implanting the nitrogen at a dosage of about $5 \times 10^{14}$ cm$^{-2}$ to about $10^{16}$ cm$^{-2}$.

11. The method according to claim 6, comprising implanting the exposed surfaces of the silicon nitride sidewall spacers with atomic nitrogen.

12. The method according to claim 6, comprising implanting the exposed surfaces of the silicon nitride sidewall spacers with molecular nitrogen.

13. The method according to claim 6, comprising forming the silicon nitride sidewall spacers at a thickness of about 850Å to about 950Å.

* * * * *